United States Patent
Banna et al.

(10) Patent No.: US 7,592,642 B1
(45) Date of Patent: Sep. 22, 2009

(54) THYRISTOR-BASED SEMICONDUCTOR DEVICE WITH INDIUM-CARBON IMPLANT AND METHOD OF FABRICATION

(75) Inventors: Srinivasa R. Banna, San Jose, CA (US); James D. Plummer, Portola Valley, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 480 days.

(21) Appl. No.: 11/398,398

(22) Filed: Apr. 4, 2006

Related U.S. Application Data

(63) Continuation-in-part of application No. 10/670,881, filed on Sep. 25, 2003, now Pat. No. 7,075,122, and a continuation-in-part of application No. 10/958,820, filed on Oct. 4, 2004, now Pat. No. 7,195,959.

(51) Int. Cl.
*H01L 29/72* (2006.01)
(52) U.S. Cl. .................. 257/107; 257/119; 257/131; 257/148; 257/156; 257/167; 257/297
(58) Field of Classification Search .......... 257/107, 257/119, 131, 148, 156, 167, 297
See application file for complete search history.

(56) References Cited

U.S. PATENT DOCUMENTS

| | | | |
|---|---|---|---|
| 3,856,586 A | 12/1974 | Borchert et al. | |
| 4,177,477 A * | 12/1979 | Hokuyo et al. | 257/156 |
| 4,323,793 A | 4/1982 | Schutten et al. | |
| H000569 H * | 1/1989 | Varker et al. | 257/297 |
| 4,965,872 A | 10/1990 | Vasudev | |
| 5,294,816 A | 3/1994 | Shekar et al. | |
| 5,448,104 A | 9/1995 | Yallup | |
| 5,559,349 A | 9/1996 | Cricchi et al. | |
| 5,627,401 A | 5/1997 | Yallup | |
| 5,681,763 A | 10/1997 | Ham et al. | |
| 6,087,683 A | 7/2000 | King et al. | |
| 6,229,161 B1 | 5/2001 | Nemati et al. | |
| 6,448,586 B1 | 9/2002 | Nemati et al. | |
| 6,459,140 B1 | 10/2002 | Johansson et al. | |
| 6,462,359 B1 | 10/2002 | Nemati et al. | |
| 6,492,662 B2 | 12/2002 | Hsu et al. | |
| 6,501,099 B2 | 12/2002 | Shah | |
| 6,512,274 B1 | 1/2003 | King et al. | |
| 6,528,356 B2 | 3/2003 | Nemati et al. | |
| 6,545,297 B1 | 4/2003 | Noble, Jr. et al. | |
| 6,552,398 B2 | 4/2003 | Hsu et al. | |
| 6,583,452 B1 | 6/2003 | Cho et al. | |

(Continued)

OTHER PUBLICATIONS

U.S. Appl. No. 10/706,162, filed Nov. 12, 2003, Nemati et al.

(Continued)

*Primary Examiner*—Edward Wojciechowicz
(74) *Attorney, Agent, or Firm*—Fields IP, PS

(57) ABSTRACT

A thyristor-based memory device may comprise two base regions of opposite type conductivity formed between a cathode-emitter region and an anode-emitter region. A junction defined between the p-base region and the cathode-emitter region of the thyristor may be "treated" with a high ionization energy acceptor such as indium in combination with carbon as an activation assist species. These two implants may form complexes that may extend across the junction region.

17 Claims, 9 Drawing Sheets

U.S. PATENT DOCUMENTS

| | | |
|---|---|---|
| 6,611,452 B1 | 8/2003 | Han |
| 6,627,924 B2 | 9/2003 | Hsu et al. |
| 6,787,816 B1 | 9/2004 | Chow et al. |
| 6,888,176 B1 | 5/2005 | Horch et al. |

OTHER PUBLICATIONS

Vittorio Privitera, *In and N in Silicon*, The IST 2000-30129 Frendtech Consortium, 2003.

Antonino La Magna, et al, *Role of the indium-carbon interaction on In diffusion and activation in Si*, Applied Physics Letters, Sep. 8, 2003, also at http://apl.aip.org/apl/copyright.jsp.

R. Baron, et al, *Nature of the 0.111-eV acceptor level in indium-doped silicon*, Applied Physics Letters 34(4), Feb. 15, 1979.

R. Baron, et al, *A new acceptor level in indium-doped silicon*, Applied Physics Letters 30(11), Jun. 1, 1977.

S. Lombardo et al., *High Temperature Annealing Effects on the Electrocal Characteristics of C Implanted Si*; J. Appl. Phys. vol. 79, No. 7, pp. 3464-3469, Apr. 1, 1996.

Ibrahim Ban et al., *Effects of Carbon Implantation on Generation Lifetime in Silicon*; Appl/ Phys. Lett.; vol. 68, No. 4, pp. 499-501, Jan. 22, 1996.

American Microsemiconductor, *Tunnel Diode and Back Diode Tutorial*; at www.americanmicrosemi.com/tutorials/tunneldiode.htm; Jul. 31, 2003.

Alan Seabaugh, *Silicon-Based Tunnel Didodes and Integrated Circuits*; University of Notre Dame; at www.nd.edu/~nano/0a1003QFDpaper_v1.pdf; Jul. 31, 2003.

V. Subramanian, et al.; A Novel Technique for In-Situ Monitoring of Crystallinity and Temperature during Rapid Thermal Annealing of Thin SI-SI-GE Films . . . ; undated; 6 pages.

F.Nemati and J.D. Plummer, A Novel-High Density, Low Voltage SRAM Cell with a Vertical NDR Device, VLSI Technology Technical Digest, 1998; 2 pages.

F.Nemati and J.D. Plummer, A Novel Thyristor-based SRAM Cell (T-RAM) for High-Speed, Low-Voltage, Giga-Scale Memories, Intl. Electron Device Mtg. Tech. Digest; 1999; 3 pages.

National Scientific Corp., TMOS Memory Cell, Breakthrough Technology in SRAM, at http://www.nsclocators.com/images/pdf/IP_tmos-2003.PDF, 2003.

R.Colin Johnson, Hybrid Tunnel Diodes Could Leapfrog Moore's Law, EE Times, Oct. 29, 2003, also at www.eetimes.com/at/news/OEG20031029S0015; 4 pages.

I.C. Kizilyalli, A.S. Chen, et al.; Silicon NPN Bipolar Transistors with Indium-Implanted Base Regions; IEEE Electron Device Letters, vol. 18, No. 3, Mar. 1997; pp. 120-122.

V. Subramanium, et al.; Controlled Two-Step Solid Phase Crystalization for High-Performance Poly . . . ; IEEE Electron Device Letters; vol. 18, No. 8, Aug. 1997; pp. 378-381.

H.G. Grimmeiss, E. Janzen, et al.; Tellurium donors in silicon; The American Physical Society, vol. 24, No. 8; Oct. 15, 1981; pp. 4571-4586.

H.R. Vydyanath, J.S. Lorenzo, F.A. Kroger; Defect pairing diffusion, and solubility studies in selenium-doped silicon; J. Appl. Phys. 49 (12); Dec. 1978; pp. 5928-5937.

A.A. Taskin and E.G. Tishkovskii; Formation of Selenium-Containing Complexes in Silicon; Semiconductors, vol. 36, No. 6, 2002; pp. 605-614.

* cited by examiner

THYRISTOR-BASED SEMICONDUCTOR DEVICE WITH INDIUM-CARBON IMPLANT AND METHOD OF FABRICATION

RELATED DATA

This application is a continuation-in-part of U.S. patent application Ser. No. 10/670,881, to Kevin Yang, et al., entitled, "Thyristor Device with Carbon Lifetime Adjustment Implant and Its Method of Fabrication," filed Sep. 25, 2003 now U.S. Pat. No. 7,075,122, which is hereby incorporated herein by reference; and a continuation-in-part of U.S. patent application Ser. No. 10/958,820, to Kevin Yang, et al., entitled "Thyristor-based Semiconductor Device and Method of Fabrication," filed Oct. 4, 2004 now U.S. Pat. No. 7,195,959, which is also incorporated herein by reference.

BACKGROUND

This invention is directed to semiconductor devices and, more specifically, to thyristor-based memory devices with select regions comprising implants of carbon as an activation assisting species and indium as a high ionization energy acceptor.

Semiconductor devices of ever-decreasing geometry have been realized for enabling the fabrication of integrated circuits of increased density and complexity. While this industry, in general, may be understood to address a variety of different types of circuits; the design, construction and manufacture of semiconductor memory devices—which may be used for storage of digital data—has conventionally been of particular interest to particular segments of the industry.

Most semiconductor memory devices may be described as static random access memory (SRAM) or dynamic random access memory (DRAM). SRAM's have conventionally been used for applications requiring quick performance and responsiveness. Quick responsiveness may be understood to enable ready availability and access to the memory for storage and retrieval of data.

In contrast, DRAM's typically have been associated with applications of reduced speed requirements. Although exhibiting responsiveness slower than conventional SRAM's, the DRAM's may still find favor by way of a density advantage.

More recently, thyristors have been introduced as a type of Negative Differential Resistance (NDR) SRAM device that may offer both speed and density advantages. Some of the more recent thyristor-based memory may also be deemed capable of realization via available CMOS processes, procedures and equipment.

One of the considerations associated with design of thyristor-based memory relates to the magnitude of a thyristor's holding current—i.e., the current necessary for the device to preserve a conductive state (on-state). If the thyristor is operable with a low holding current, low power dissipation may be achieved. However, the minimum current level may depend on a desired reliability (e.g., maximum tolerable error density) and noise immunity.

The noise immunity for the thyristor-based memory cell may be related to its blocking characteristics. If the gain of the thyristor is too great, then the threshold level of the thyristor's blocking state may drop to a level that may hinder data preservation. An excessive gain may cause the thyristor to be vulnerable to noise influences, wherein the noise may erroneously toggle the thyristor from a non-conductive state to a conductive state. For similar reasons, it may be difficult to transition a thyristor of excessive gain from a conductive state to a non-conductive state.

Accordingly, a compromise may be evident when selecting a gain for the constituent bipolar devices for a thyristor of a thyristor-based memory. The selection of a gain too low for the bipolar devices of the thyristor may hinder the ability to write and preserve data of a first type (conductive state) within the thyristor. On the other hand, the selection of a gain too great may, alternatively, hinder the ability to write and preserve data of a second type (non-conductive state). Thus, thyristor design typically may address the selection of bipolar gain that may permit reliable writing and storage of either of first-type or second-type data. Further, the design may also address concerns for reliable fabrication in consideration of given variances that may affect gain of a bipolar device.

Environmental conditions such as temperature may be understood to influence the performance of semiconductor devices. Thus, during manufacture of thyristor-based semiconductor memory, various processes—e.g., doping, implant, activation, anneal procedures, and the like—may include tolerance levels or limitations that may contribute to device variations; and, likewise, the reliability of the thyristor-based memory to handle data with immunity to noise, environmental influences and temperature variation.

SUMMARY

In accordance with certain embodiments of the present invention, a thyristor-based memory comprises a substrate, at least a portion of which may be implanted with both a high ionization energy acceptor and an activation assist species. In a particular embodiment of the present invention, the high ionization energy acceptor may comprise indium, while carbon may serve as the activation assist species.

In a further embodiment, a thyristor-based memory cell comprises a thyristor and an access transistor to access the thyristor. A source/drain region of the access transistor may be electrically in common with the cathode-emitter region of the thyristor. A base region (e.g., P-base) of the thyristor may define a junction relative to the cathode-emitter region, and may include implants of indium and carbon. In a particular embodiment, a distribution of the indium and carbon implants may extend across the junction defined between the P-base region and the cathode-emitter region.

In accordance with another embodiment, a method of forming a thyristor-based memory may implant the carbon and indium into the P-base region for the thyristor via an angled implant through at least a portion of the cathode-emitter region. The angled implant may use an angle of incidence from 30 to 60 degrees relative to the exposed surface of the cathode-emitter region.

In accordance with a further embodiment, a method of fabricating a thyristor-based memory may implant carbon and indium into select regions for a thyristor before definition of gate electrodes to access transistors or capacitor electrodes to thyristors. A mask may be patterned over a substrate to form a window therethrough and expose a portion of silicon to be associated with a thyristor. In a particular embodiment, the exposed portion defined by the mask window may correspond to part of a P-base region and part of a neighboring cathode-emitter region. Indium and carbon may then be implanted using substantially direct angles of incidence—e.g., within ±7 degrees of the perpendicular, and more typically ±4 degrees. Following the implant, an anneal may be performed using temperature between 600 to 1200 degrees Celsius and a duration from several seconds to several minutes. In further embodiments, a gate oxidation process associated with formation of gate dielectrics may be of sufficient thermal budget to also serve purposes of anneal of the indium and carbon implants.

BRIEF DESCRIPTION OF THE DRAWINGS

The subject matter of embodiments of the present invention may be understood by reference to the following detailed description and with reference to the accompanying drawings, in which.

DETAILED DESCRIPTION

Figure 1:
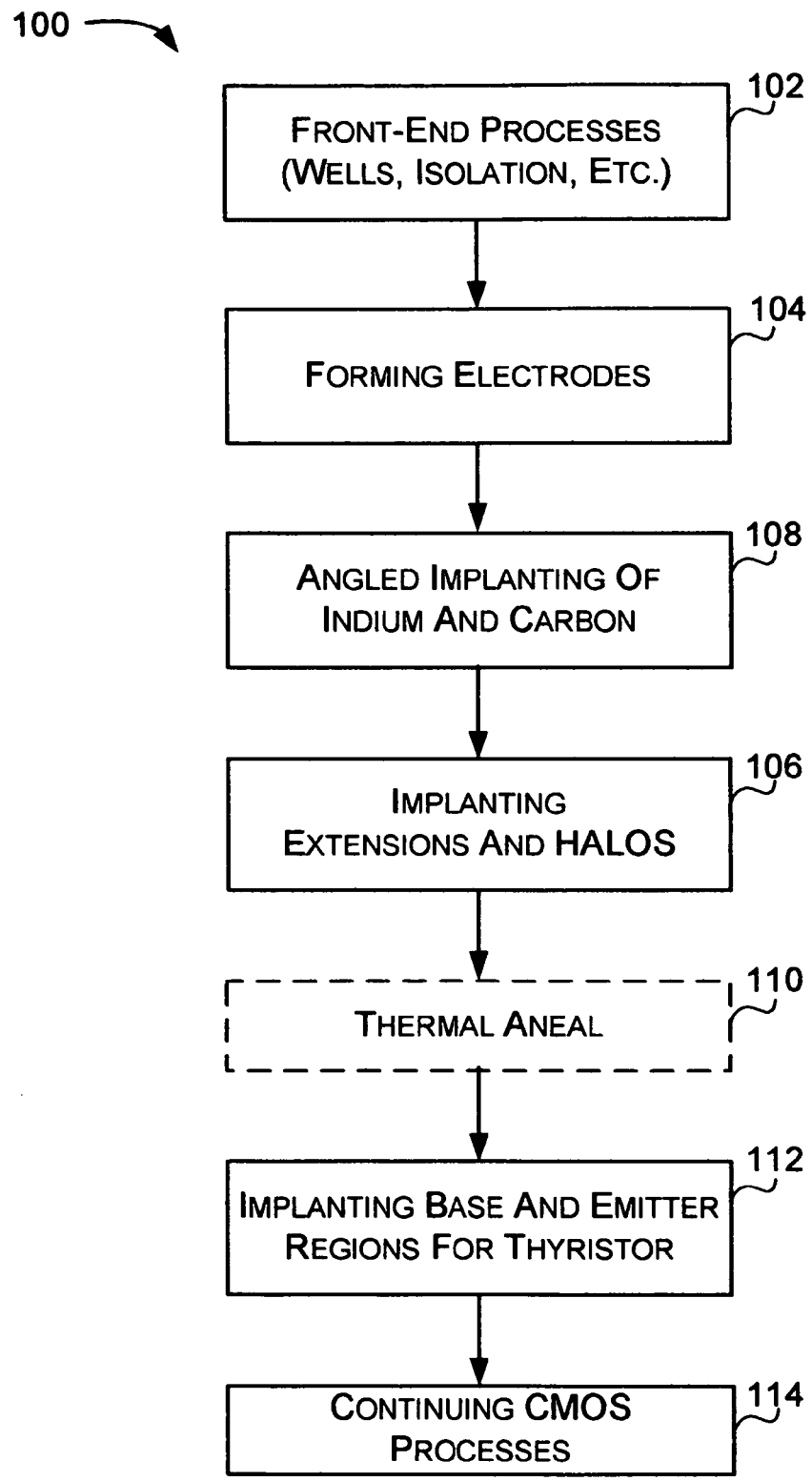
FIG. 1 is a simplified flow chart illustrating a method of forming a thyristor-based memory according to an embodiment of the present invention, including an implant of carbon together with indium as a high ionization energy acceptor into a P-base region for a thyristor.

In the description that follows, readily established circuits and procedures for the exemplary embodiments may be disclosed in a simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may be also included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with a substrate.

Furthermore, those skilled in the art will recognize that although embodiments of the present invention may describe fabrication with particular dopants—e.g., such as boron or indium—molecular compounds containing those dopants (e.g., $BF_2$ or compounds containing indium) may be used during particular phases of the fabrication or may serve as source for the particular dopants as may be referenced herein.

Also, as referenced herein, portions of electrical components (e.g., a transistor or thyristor) may be described as being formed in, at or on a semiconductor substrate. Such alternative terms in/at/on may be used individually merely for purposes of convenience. In the context of forming semiconductors, such terms may reference portions collectively of a semiconductor element that may be within and/or on a starting (or intermediate or handling) structure or material.

Similarly, the terms portion, area, and region, depending on context, may be synonymous. For example a portion of a device may again, depending on the context, also accurately be referred to as an area of the device or as a region of the device. In a particular context, one synonymous term may be chosen instead of another merely for purposes of convenience. Further, a first region, depending on context, might also overlap a second region.

In a method 100 of fabricating a thyristor-based memory device according to an embodiment of the present invention, referencing FIG. 1, active regions may initially be defined in a substrate. For example, a (bulk) semiconductor substrate may comprise P-type semiconductor material. Given active regions may be defined therein by implanting N-type dopant to form N-wells therein. Additionally, isolation trenches might also be formed between different active regions. Such known procedures may be understood to be represented within block 102 (e.g., the CMOS process for the formation of wells, isolation, and the like) of the simplified flow chart of FIG. 1. Further, it may be understood that the procedures of block 102 might also be representative of similar initial processes for an SOI substrate e.g., a layer of silicon over an insulator.

Figure 2A:
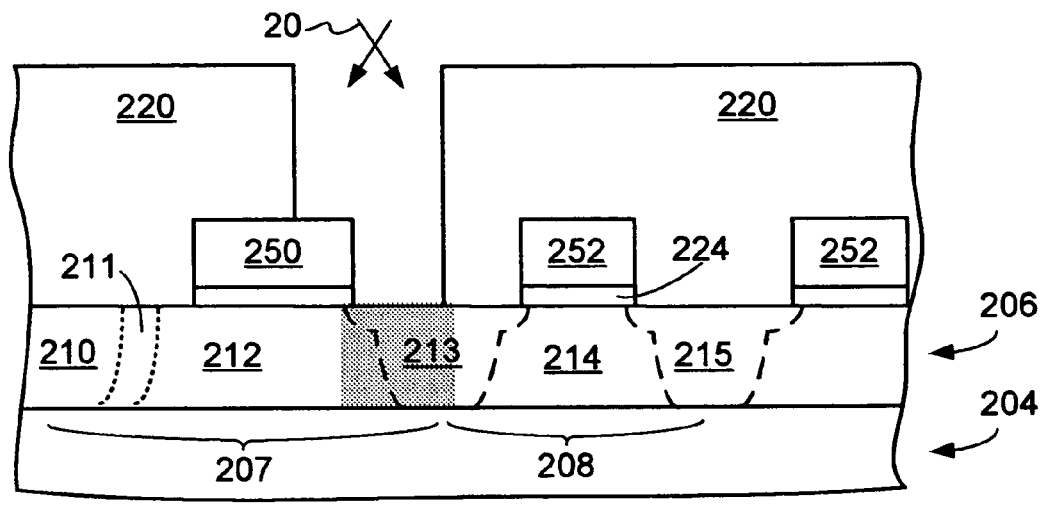
FIG. 2A is a simplified cross-sectional view of a portion of a semiconductor device in a given stage of fabrication, useful for describing a method of fabricating a thyristor-based memory device for an embodiment of the present invention, showing an angular implant of carbon as an activation assisting species and indium as a high ionization energy acceptor into a P-base region for a thyristor.
Figure 2B:
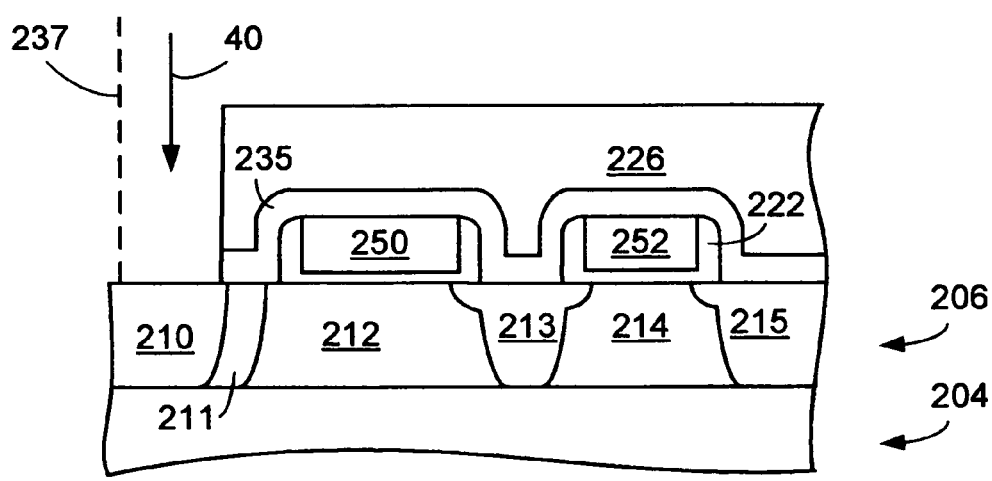
FIG. 2B is a simplified cross-sectional view of a portion of the semiconductor device of FIG. 2A, in another stage of fabrication, showing formation of an anode emitter region together with definition of the width for an N-base to the thyristor.

Further referencing the simplified flow chart of FIG. 1 in combination with simplified sequential drawings of FIGS. 2A-2B, dielectric 224 may be formed over a layer of silicon 206 over insulator 204 of an SOI substrate, which might also be incorporated as part of the preliminary "CMOS Process" (block 102, FIG. 1). In a particular embodiment, dielectric 224 may be formed as a thermal oxide; it might also be described as a gate oxide or gate dielectric. Polysilicon may then be deposited and patterned (block 104 of FIG. 1) over the gate dielectric to define electrodes 250, 252. One electrode 252 may serve as the gate for an access device, e.g., MOSFET 208, and the other electrode 250 may serve as a capacitor electrode to be capacitively coupled to a base-region 212 for thyristor 207.

The gate electrode 252 for the MOSFET may be formed over the gate oxide 224 and in insulated relationship over body region 214. Similarly, the capacitor electrode 250 may be formed in insulated relationship over the base region 212 (e.g., P-base region) for the thyristor. The capacitor electrode 250 may be described as capacitively coupled thereto via dielectric (e.g., via a thermal or gate oxide or other insulator). In one embodiment, polycrystalline silicon for the electrodes may be formed with a thickness of between about 80 nm to 1 μm, and typically around 200 nanometers.

Referencing FIG. 2A, mask material (photoresist) 220 may be deposited and patterned to mask and protect portions of the substrate that are to be associated with thyristor 207, such as an N-base region. The mask may also protect portions for the access device including the bitline contact or source/drain region for this embodiment. The dash lines indicate the desired location for an N-base in the substrate. The exposed region of silicon layer 206 may correspond to a portion that is to be associated with the cathode-emitter region 213 for the thyristor. The implant of indium and carbon may be directed through the exposed portion of the cathode-emitter region for penetrating the neighboring region for the base 212. In one example, mask 220 may be formed from photoresist with a thickness sufficient to substantially prevent penetration of carbon into the masked silicon regions, and may have a thickness that is greater than at least 1000 angstroms (Å), such as a thickness of about 4000 Å (about 400 nanometers). In a particular embodiment with reference to FIG. 2A, the opening through the mask may be defined in part by a peripheral edge of capacitor electrode 250 that is to be capacitively coupled to the P-base for the thyristor.

In further fabrication of the thyristor-based memory device, a high ionization energy acceptor may be implanted into certain regions of the substrate that are to be associated with a base region for the thyristor. The high ionization energy acceptor may be characterized with an ionization energy that is sufficiently large to effect a variation in the percentage of atoms ionized over and dependent on operating temperature, for example, an ionization energy (i.e., $E_g$) greater than 0.045 eV from the valence band in silicon. In one embodiment, indium may be used as the high ionization energy acceptor with an ionization energy in silicon as large as about 0.160 eV.

Continuing with this embodiment of the present invention, the method of fabricating the thyristor-based memory may further comprise implanting carbon as an activation assist species for assisting activation of the indium (block 108, FIG. 1) in the semiconductor material. The carbon may be implanted into the same regions that are to receive the indium, i.e., at least a portion of the base region for the thyristor. So, while indium may be implanted as a high ionization energy acceptor in silicon, the carbon may be implanted as an activation assist species to influence the activation of the indium. Indium in the base region may allow for a more consistent and stable bipolar gain of the thyristor over a range of operating temperatures. The carbon in combination with the indium may further enhance the proportion of the high energy acceptor that may be available for assisting influence of the gain of a constituent bipolar transistor of the thyristor for further stabilization of the thyristor (with respect to temperature).

For purposes of assisting understanding, the high ionization energy acceptor may be described as providing properties different from those of traditional trivalent dopants such as boron. For example, the indium dopant may be theorized as being operable to affect gain mechanisms of a base region, per modeled Gummel number relationships of the base region 212 for a bipolar device relative to that of the emitter region 213. That is, the indium dopant may influence and/or compensate for an otherwise traditional increase in effective bipolar gain of thyristor 207 with respect to increasing operating temperature. Stated alternatively, indium as a high ionization energy acceptor may influence and/or compensate a temperature dependent bipolar gain within thyristor 207.

Because indium exhibits high ionization energy in silicon, i.e., 0.156 eV, it may be understood to lend only a portion thereof to ionization, which proportionate amount may be based on temperature. Accordingly, the resulting hole concentration within the semiconductor material may be influenced by the amount of indium that is ionized, which in turn may be less than the total amount of the implanted indium. It may be further understood, therefore, to lend a lower effective carrier concentration in the silicon at low operating temperatures due to the temperature dependent level of ionization. Furthermore, at a certain low level temperature, the partial ionization of indium in the silicon may be further restricted by a phenomenon that may be referenced as "impurity freezeout," wherein the lower effective doping level may be characterized as being dependent upon a relatively low solid solubility of the indium in silicon—e.g., of about $1 \times 10^{17}/cm^3$ or less. In other words, the low solid solubility of indium in silicon may be theorized to limit the amount of indium that may be available to affect ionization of acceptors within the silicon and ultimately limit the proportion of indium available for aiding temperature stability of the thyristor.

In accordance with some embodiments of the present invention, therefore, it is proposed that the addition of carbon implants with sufficient dosage may assist activation of the indium in silicon and its diffusion therein. In these embodiments, the carbon may be implanted together with the indium and may form indium-carbon pairs and/or complexes in the silicon. These complexes, in turn, may be theorized to introduce a shallower acceptor energy level at, e.g., about 0.111 eV from the valence band. For purposes of assisting an understanding of certain embodiments, one proposed theory may further note that indium has a covalent radius (1.44 Å) larger than silicon (1.17 Å), while carbon has a smaller one (0.77 Å); hence, an indium-carbon pair and/or complex, which might act as a single acceptor, could strain the lattice less than either a separate indium or carbon atom. This might then lead to a reduction in strain energy when indium-carbon atoms occupy neighboring sites in the lattice (the strain energy of indium in silicon about 0.7 eV and that for carbon in silicon about 1.4 eV). The indium-carbon pair and/or complex may thus provide a strain relief with less binding energy.

The implanting of carbon and indium may be performed, in this embodiment, referencing FIG. 2A, using an angled implant trajectory. The angled implants (block 108 of FIG. 1) of indium and carbon 20 may be driven through at least a portion of cathode-emitter region 213 and into the region for the P-base for the thyristor 207. The extent of the implanted region may be defined by the angle of implants, energy of implants (the depth of implants), and the lateral placement of electrode 250. These angled implants of indium and carbon may also be understood to be distributed across a depletion or boundary zone associated with the pn junction defined between the regions for the P-base and the cathode-emitter.

Once implanted, the carbon atoms in the silicon substrate may interact with the indium atoms to form indium-carbon substitutional pairs and/or complexes. The activation of indium and its diffusion in the P-base region may be assisted, therefor, by the carbon in the silicon. The implantation energy selected to drive the indium and the carbon atoms through the cathode-emitter region 213 could vary according to the depth and width for the P-base region and, possibly, that of cathode-emitter region 213. In the cases described with reference to FIGS. 2A-2B, cathode-emitter region 212 may be understood to further comprise a heavily doped $N^+$ region neighboring the P-base 212.

Figure 8A:
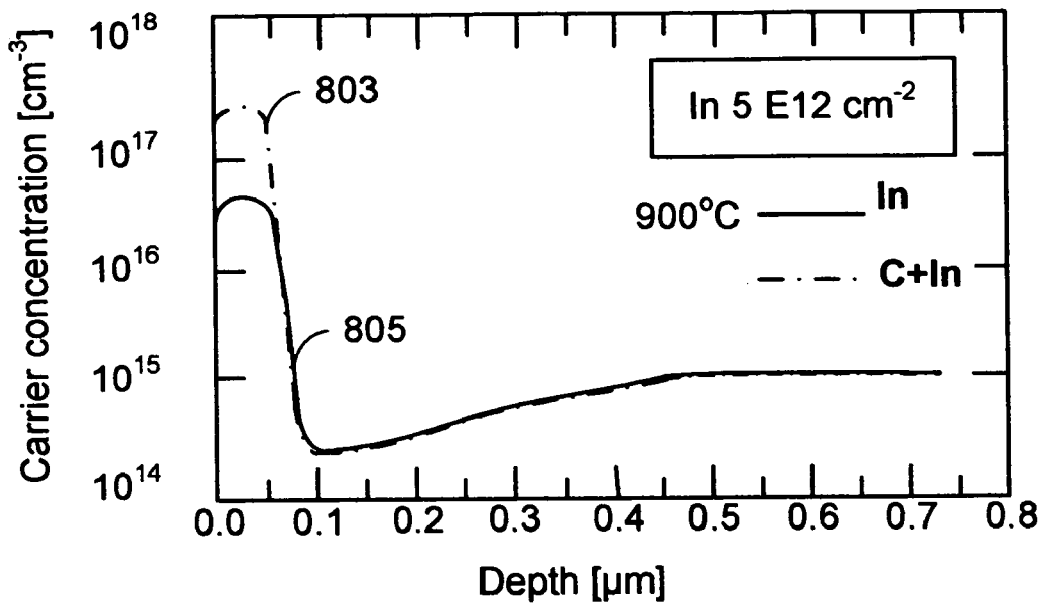
FIGS. 8A-8B are graphs showing the influence of carbon on electrical activation of indium in silicon, for two different exemplary embodiments with indium implant, e.g., of dosages of $5\times10^{12}/cm^2$ (FIG. 8A) or $5\times10^{13}/cm^2$ (FIG. 8B) respectively, as may be useful to assist an understanding of characteristics that may be associated with certain embodiments of the present invention.
Figure 8B:
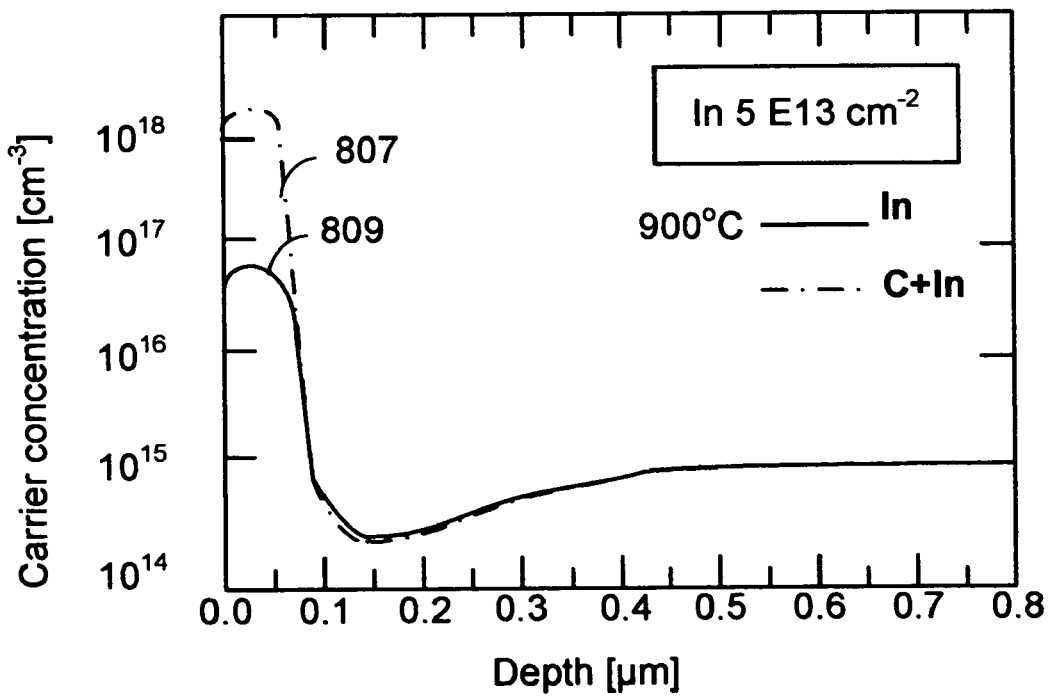

Moving forward with reference to the graphs of FIGS. 8A and 8B, and relative to a particular example where the silicon layer may comprise a thickness of about 1000 Å, the implanting of high ionization energy acceptor 20 may establish a concentration distribution profile therefor through the depth of the silicon layer. For example, for one embodiment, implant energy of about 80 keV may be used during implant of indium with dosage of about $5\times10^{12}/cm^2$. And, with an anneal process of about 900 degrees Celsius, and the addition of carbon may yield a minority carrier (i.e., hole) concentration 803 of magnitude about three times greater than that 805 absent the carbon. In another example of the same implant conditions, but indium dose of $5\times10^{13}/cm^2$, the addition of carbon may lend an even higher yield enhancement—i.e., enabling a peak carrier concentration enhancement (803 versus 809 per FIG. 8B) in the silicon layer of about 7.6 times. It may be understood that the resulting hole concentration may also depend on process conditions for the device, including, e.g., the temperature of oxidation and/or other processing conditions.

Further referencing FIG. 1, in a particular embodiment, a thermal anneal 110 may be performed following the angled implants of carbon and indium. Such thermal anneal may re-crystallize silicon in the substrate and remove damage in the crystal structure as may have been caused by the implants. In further embodiments, the thermal anneal for the activation of the indium and carbon could be performed by way of other thermal process as may be incorporated with the device fabrication, for example, via the source/drain dopant activations. Alternatively, a thermal anneal for the carbon and indium activation might be performed therefor separately from and in addition to other thermal processes. Such anneal could employ a temperature from 500 to 1300 degrees Celsius and for duration as short as 5 seconds to as long as 10 to 15 minutes or even longer (e.g., hours).

With respect to the indium and carbon implants, the heat treatment anneal may be performed to diffuse the implanted ions and to stimulate formation of pairs and/or complexes. In some embodiments, lower temperature heat treatments may be used and may favor the formation of pairs and/or complexes. In particular embodiments, the formation of pairs and/or complexes may be stimulated with heat treatments or anneals with a temperature up to 650° C., and over long duration of, e.g., several minutes or hours.

In the embodiments described above, the implant of indium was described with an implant energy of 80 keV. In alternative embodiments, these implants may be performed using an implant energy of, e.g., 70 to 120 keV, which may be determined based upon the depth of the silicon layer, the angle of implant and the extent desired therefor. Additionally, the dosage for the indium could range from $1\times10^{12}/cm^2$ to $1\times10^{13}/cm^2$.

With respect to the carbon implants, the dosage may be defined with magnitude sufficient to establish a concentration therefor in the silicon effective for assisting activation of the indium implants. For example, the carbon may be implanted with a dosage of at least about $1\times10^{15}/cm^2$. In further embodiments, the carbon may be implanted using a dosage of between $2\times10^{15}/cm^2$ and $1\times10^{16}/cm^2$. The upper dosage level, for some embodiments, may be selected with magnitude sufficiently light so as to discourage clustering of the carbon within the silicon.

Further, in some embodiments, the carbon for the carbon implant may be supplied to a process reaction chamber in gaseous form to an implant chamber the same as that used for the indium implant. Additionally, the selected regions of silicon to receive the carbon may be established by the same mask as that which was used during the indium implant. By such common or shared implant mask and, optionally, shared reaction chamber, the implants of carbon and indium might be characterized as "co-implants." However, it will be understood that, typically, one of the carbon and the indium is implanted first, followed by a separate, second or sequential implant for the other. For example, the carbon could be implanted before the indium or vice versa. In accordance with particular embodiments, the angled implants 20 for the indium and carbon may be direct toward the surface of the layer of silicon to define an acute angle of incidence relative thereto that is between 25 and 55 degrees.

Following the angled implants for the indium and carbon, dielectric such as oxide may be formed conformal to and over the substrate and electrodes. An anisotropic etch may be used to etch the dielectric and form spacers 222 against sidewalls of the electrodes (e.g., 222 of FIG. 2B). In some embodiments, the sidewall spacers may be formed while masking regions of the substrate for the thyristor; while, in other embodiments, the formation of sidewall spacers may be deferred, perhaps until further CMOS processing 114 (infra. herein below).

Moving forward, extension and halo CMOS processes may be performed (block 106 of FIG. 1) to define, e.g., at least the extension regions (e.g., LDD) for access transistor 208. A photoresist mask may be formed to protect regions of the semiconductor to be associated with the thyristor device and to expose locations for the CMOS devices. The N-type extension regions (e.g., for lightly doped drain or LDD regions) may be formed about gate electrode 252 by an implant of N-type dopant. In one embodiment, the implants for the extension regions may be performed using phosphorous with an implant dose of about $8\times10^{14}/cm^2$. And, in some embodiments, these extensions may be formed before development of spacers 222 against the sidewalls of electrodes 250, 252.

Halo implants (block 106) might also be implanted to location(s) between or proximate the extension regions and the body region, e.g., p-body region for a MOSFET. In a particular embodiment, the halo implants may be formed as known in the industry, e.g., boron implanted with predetermined dosage and implant angle.

Although particular magnitudes may be described for the doping levels, material thickness, extents and dimensions for given embodiments; it may be understood that such specifics are merely exemplary and that alternative magnitudes may be available therefor.

Following the extension and halo implants, further processes may be performed for completing fabrication of the thyristor. For example, base and emitter implants may be performed for formation of the N-base and anode-emitter regions to the thyristor. Referencing FIG. 2B, previous photoresist 220 may be removed and dielectric 235 may be layered conformally over the substrate, including regions (shoulder) of the capacitor electrode 250. Additional photoresist 226 may then be layered and patterned to assist the formation of the N-base and the anode-emitter regions for the thyristor (block 112 of FIG. 1). Using the patterned photoresist as an etch mask, exposed regions of dielectric may be removed, e.g., from between the capacitor electrodes of the two neighboring thyristor devices about mirror axis 237. The etch may define a wing to the dielectric, which may be operable as a Salicide Blocking (SAB) mask 235, adjacent and extending laterally from the capacitor-electrode 250 toward the anode-emitter region. The material for such SAB mask might also be used for definition of standard spacers for logic devices in the periphery. The SAB mask may define select silicide regions of the silicon and electrodes per known salicide processes in this method of fabrication.

In one embodiment, the lateral extent of the wing to the SAB spacer 235 may comprise a distance greater than its conformal thickness, and sufficient to form an N-base region (e.g., lateral width of up to about 100 nm) therebelow and yet with a lateral offset relative to a peripheral wall or edge of electrode 920.

Further referencing FIG. 2B, the patterned dielectric 235 and photoresist 226 may be used collectively as an implant mask during formation of N-base region 211 and anode-emitter region 210. For example, an angled implant for the formation of the N-base region may use a species such as phosphorous, with an implant angle of about 30 degrees (relative to the horizontal), energy of about 60 keV, and dosage of about 4×10^14, twisted. It will be understood, that the specifics for the implant species, angle and energy in combination with the lateral extent of the implant mask may be selected with parameters sufficient to define a boundary for N-base region 211 beneath the shoulder of dielectric 235 yet laterally offset short of capacitor electrode 250.

For example, in another embodiment, the implant for the N-base may use an implant species of arsenic, an implant angle of about 30 degrees, energy of about 10 keV, and dosage of about $1 \times 10^{15}/cm^2$, twisted.

Further referencing FIG. 2B, after performing the N-type implant for N-base region 211, the same mask may be used during implant of P-type species 40 to form anode-emitter region 210. In one embodiment, a species of boron may be implanted for the anode-emitter with an energy of about 9 keV, implant angle of less than about 4 degrees (relative to the normal or vertical axis) and a dosage of at least $3 \times 10^{16}/cm^2$, twisted. Again, these levels are representative of simply one embodiment. It may be understood that mirror image thyristor and access devices may be formed in mirror image relationship about mirror axis 237.

Figure 2C:
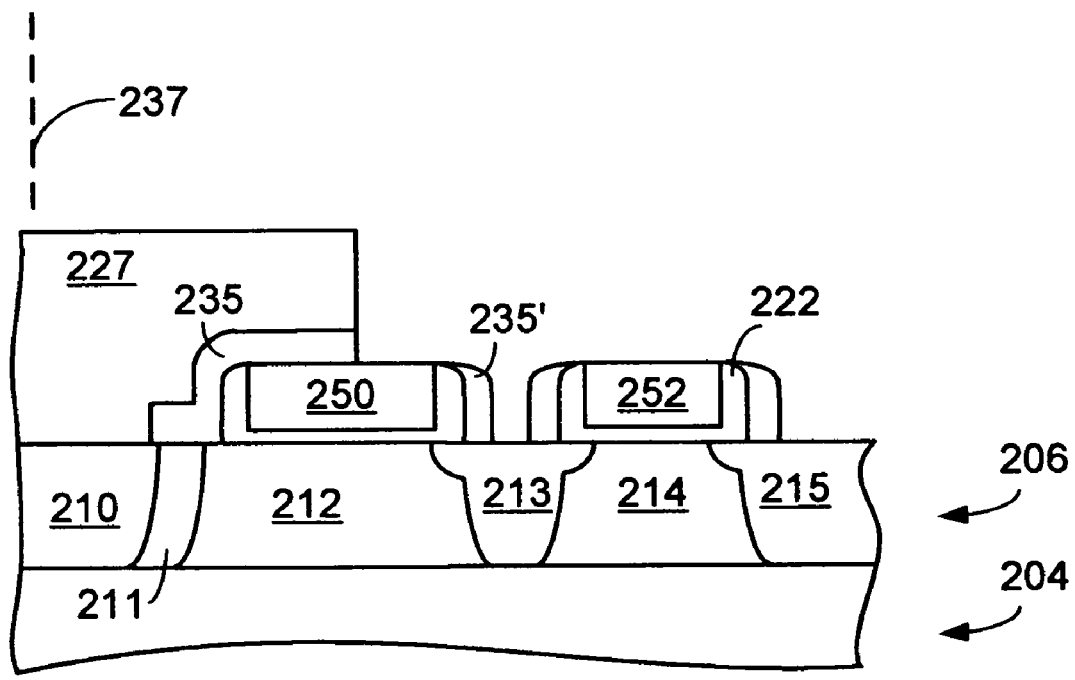
FIG. 2C is a simplified cross-sectional view of a portion of the semiconductor device of FIG. 2B, in another stage of fabrication, showing further patterning of dielectric material and formation of offset spacers.

After implanting N-base, referencing FIG. 2C, anode-emitter implants, dielectric 235 is anisotropically etched using a photomask outside regions 210, 211 and 212 to define spacers in the cathode-emitter, access device source/drain and periphery device source/drain regions.

Further referencing FIGS. 1 and 2C, N-type species may be implanted with high energy to form the deep (e.g. N+) source and drain regions 213, 215, which may be formed self-aligned relative to peripheral edges of electrode 252 with sidewall spacers. In a particular embodiment, these implants for the deep source and drain regions may use species such as arsenic with an energy and dosage to penetrate a full depth (e.g., 1000 Å) of the layer of silicon 206 of SOI substrate. For example, the implant may use an energy of about 40 keV and dosage of about $5 \times 10^{15}/cm^2$. Typically, these deep source/drain regions may be formed after performing the implant(s) of indium and carbon and associated anneals. Thus, these regions for the deep source/drain regions have been referenced in FIG. 2A with phantom lines and may be understood to be incorporated as a part of in the Continued CMOS Processes block 114 of FIG. 1.

Figure 3:
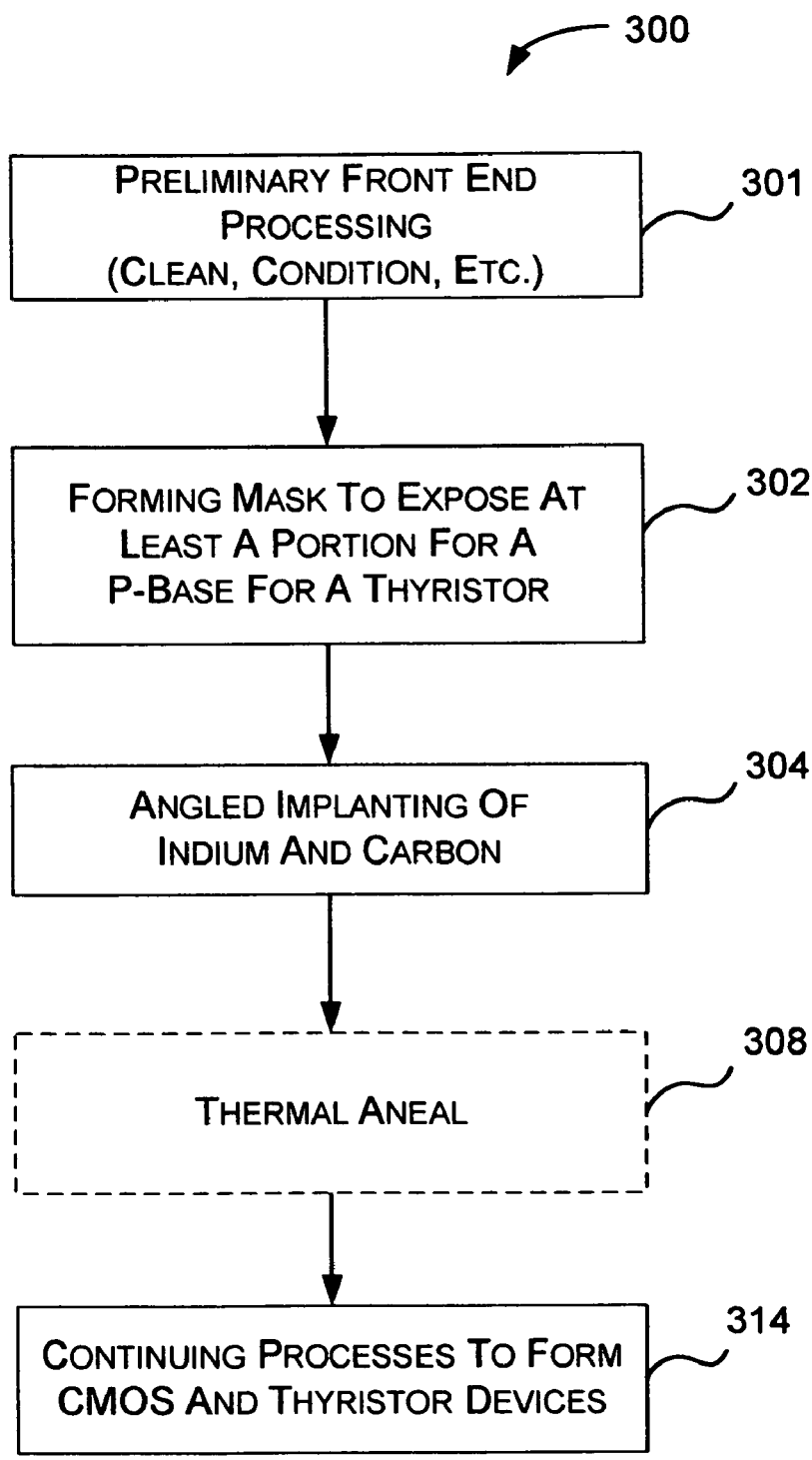
FIG. 3 is a simplified flow chart for a method of forming a thyristor-based memory device, in accordance with another embodiment, which includes implant of carbon and implant of indium as a high ionization energy acceptor before formation of gate and capacitor electrodes.
Figure 4A:
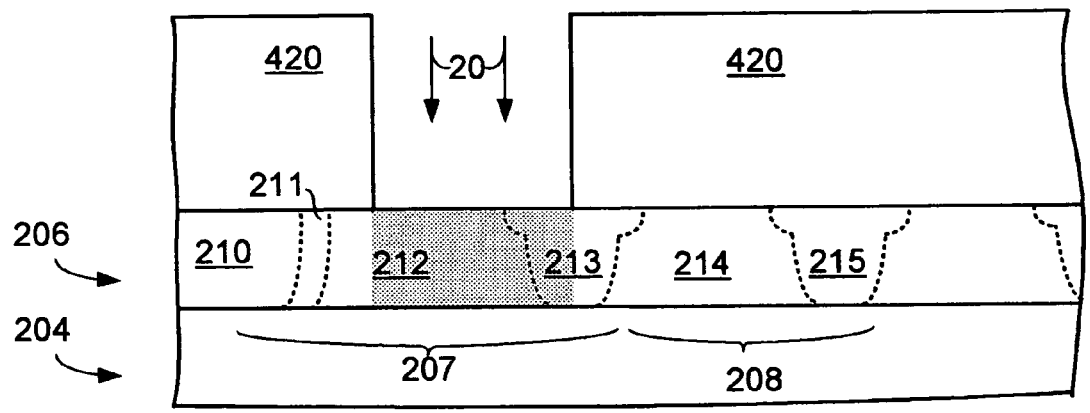
FIG. 4A is a simplified cross-sectional view of a portion of a semiconductor device in a given stage of fabrication, useful for describing a method of fabricating a thyristor-based semiconductor memory device in accordance with an embodiment of the present invention, showing a window of a mask defining an exposed region for implant of carbon as an activation assist species and indium as a high ionization energy acceptor.
Figure 4B:
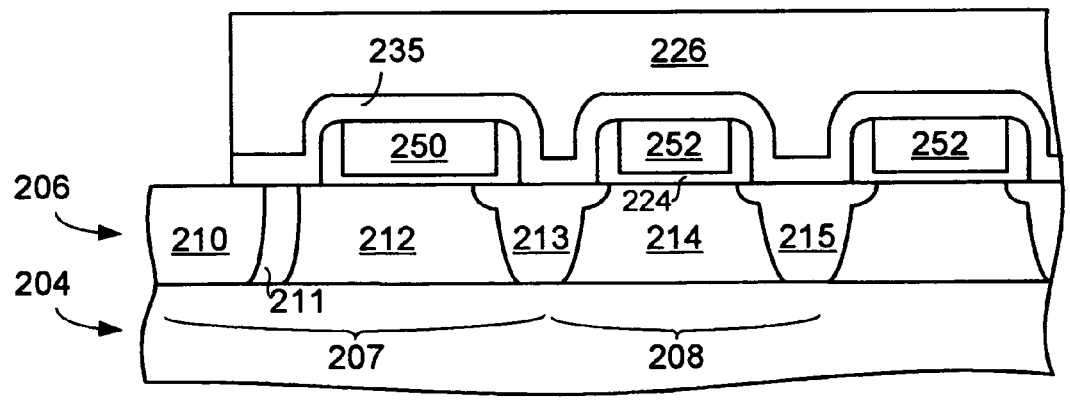
FIG. 4B is a simplified cross-sectional view of a portion of the semiconductor device of FIG. 4A, in a further stage of fabrication, showing formation of an anode emitter region together and a width to the N-base for the thyristor.

In accordance with another embodiment of the present invention, referencing the simplified flow chart of FIG. 3 and the simplified sequence of FIGS. 4A-4B, the carbon and indium may be implanted directly into the silicon substrate prior to forming electrode for the access device or the electrode to the thyristor. As part of method 300, initial preliminary CMOS processing, in accordance with one alternative, may have been previously performed to form wells, isolation trenches and active regions for SOI substrate preliminaries similarly as described before relative to FIG. 1. Alternatively, these wells and isolation structures can be formed following the indium and carbon implants of the present embodiment.

Photoresist may be layered and patterned (block 302 of FIG. 3) to define a mask 420 with a window to expose a region of the silicon 206. The exposed regions defined by the window may include a portion for where a cathode-emitter region 213 is to be formed and at least a portion for where a P-base region 212 is to be formed for a thyristor. The mask may also serve to protect regions for where a gateable access device is to be formed. Implants 20 of carbon (as the activation assist species) and indium (as the high ionization energy acceptor) may then be performed (block 304) using substantially direct implant angles, e.g., within about ±7 degrees relative to the normal, and more commonly about ±4 degrees.

It may be noted, further referencing FIG. 4A, that the different regions that are to be formed for the thyristor and the gateable access device have been shown simplistically with dashed lines within the layer of silicon 206 of an SOI substrate. These phantom boundaries may assist description and understanding of the particular regions of the silicon layer that are to receive the implants of carbon and indium relative to the intended regions for the thyristor.

Continuing with further reference to FIG. 4A, the carbon and indium may be implanted (block 304 of FIG. 3) into the exposed regions of silicon layer 206 as defined by the window of mask 420. In a particular embodiment, the layer of silicon 206 of the SOI substrate may have a thickness of about 1,000 Å. The exposed region may be associated with a substantial portion for the P-base region 212. The dose of indium may be about $2 \times 10^{12}/cm^2$, with an implantation energy of about 80 keV, and using an implantation angle from 83 to 97 degrees as measured from the surface of silicon layer 206 (i.e., within about ±7 degrees from an axis normal thereto).

Further referencing FIG. 3, once the carbon and indium have been implanted, the photoresist mask 420 may be removed and a (optional) thermal anneal may be performed (block 308) to activate the implants within the silicon. The thermal anneal may remove implant damage and re-crystallize the silicon. Although a variety of thermal anneals may be used, in a particular embodiment, the thermal anneal may comprise heat exposure of up to about 650 degrees Celsius for about 30 minutes.

In a further embodiment, the anneal for activation of the indium and carbon implants within the silicon may be associated with heat treatments connected with subsequent procedures during further fabrication of the thyristor-based memory device, such as during gate oxidation processes, gate electrode formation, other dopant activation anneals and/or silicide procedures.

Again, the high ionization acceptor of indium and the activation assist species of carbon may be implanted into the selected portions for the thyristor, which selected portions may include at least a portion for the P-base 212 and, in a further embodiment, also a junction region to be defined between the P-base region 212 and the region 213 for the cathode-emitter.

Further processes for fabrication (block 314) of the thyristor-based memory device for this embodiment may follow provisions similar to those described previously relative to FIG. 1. In particular, it may be noted that during the formation of the gate oxide or dielectric 224 over the layer of silicon 206, in accordance with some embodiments, the oxide may be formed by known thermal oxide procedures. This may include, e.g., exposure to an ambient environmental temperature of, e.g., about 950 degrees Celsius for a duration from 1 to 10 minutes during formation of the oxide. An additional anneal might then follow the oxide formation, and may employ a temperature, e.g., of 1015 degrees Celsius for a duration from seconds to minutes, e.g., 30 seconds to several minutes.

Figure 5:
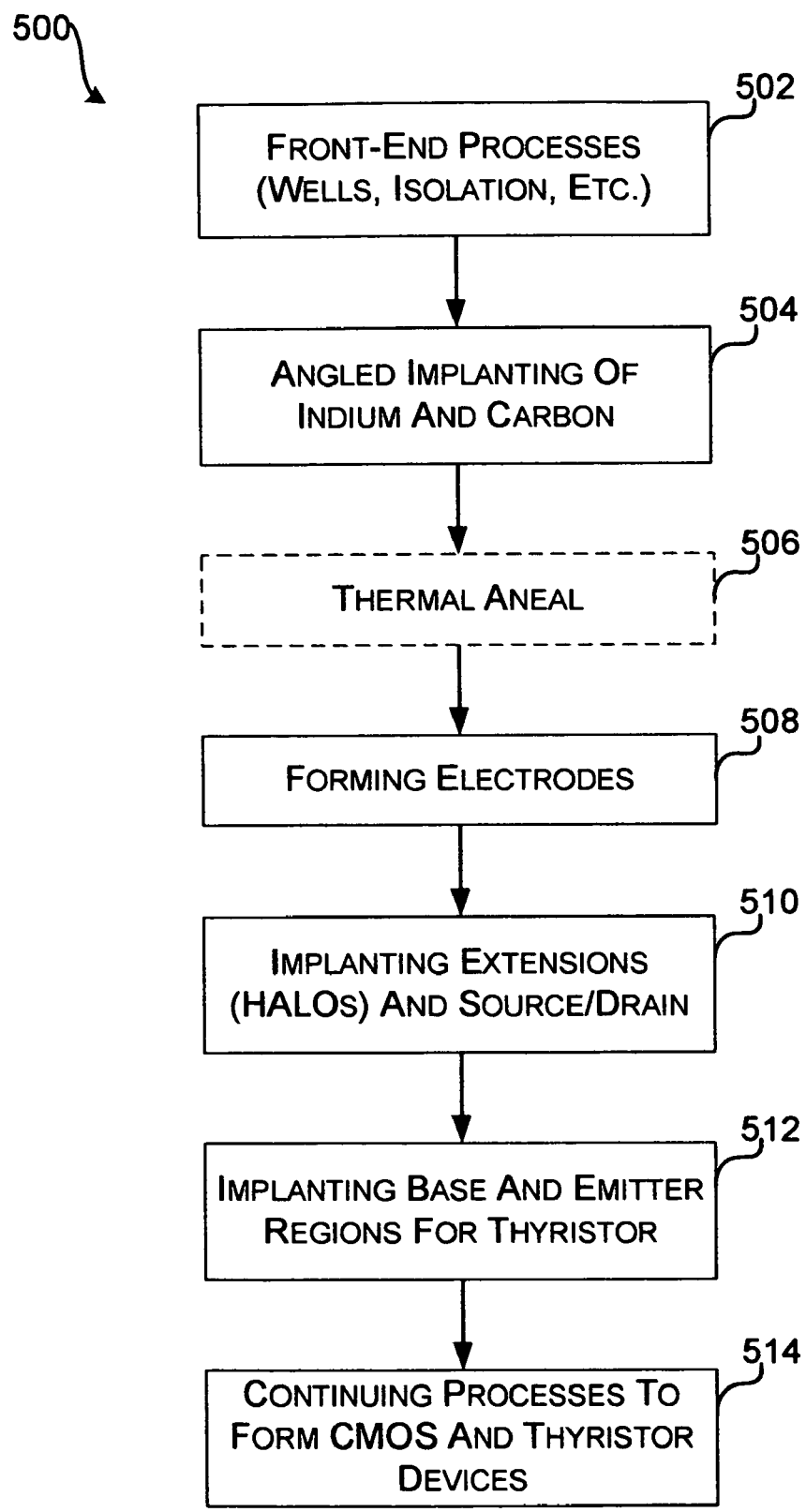
FIG. 5 is a simplified flow chart for a method of forming a thyristor-based memory device in accordance with yet another embodiment, including implant of carbon and indium as a high ionization energy acceptor into select regions for a thyristor.
Figure 6A:
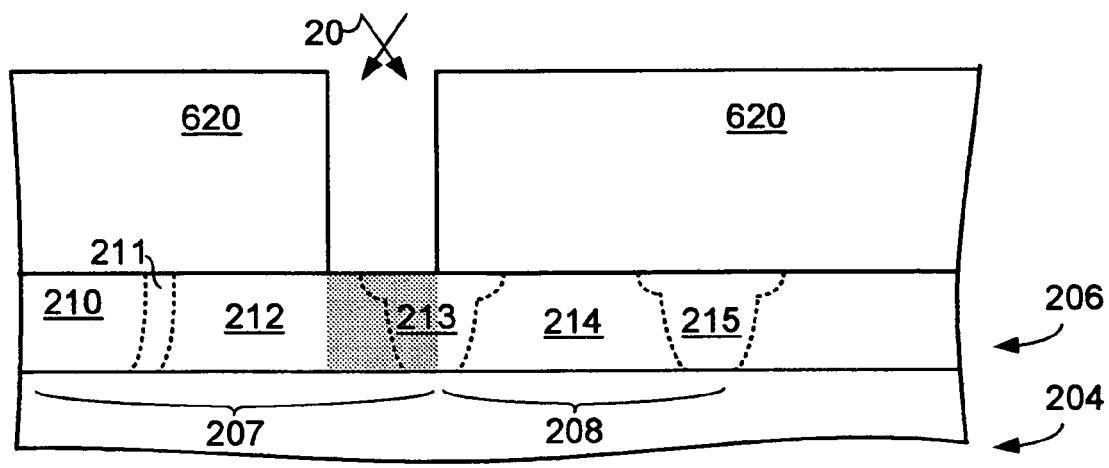
FIG. 6A is a simplified cross-sectional view of a portion of a semiconductor substrate in a given stage of fabrication, useful for describing a method of fabricating a thyristor-based semiconductor memory device, and showing formation of a mask with a window to expose a select region of the substrate including portions where a thyristor will be formed and showing implant of carbon and/or indium.
Figure 6B:
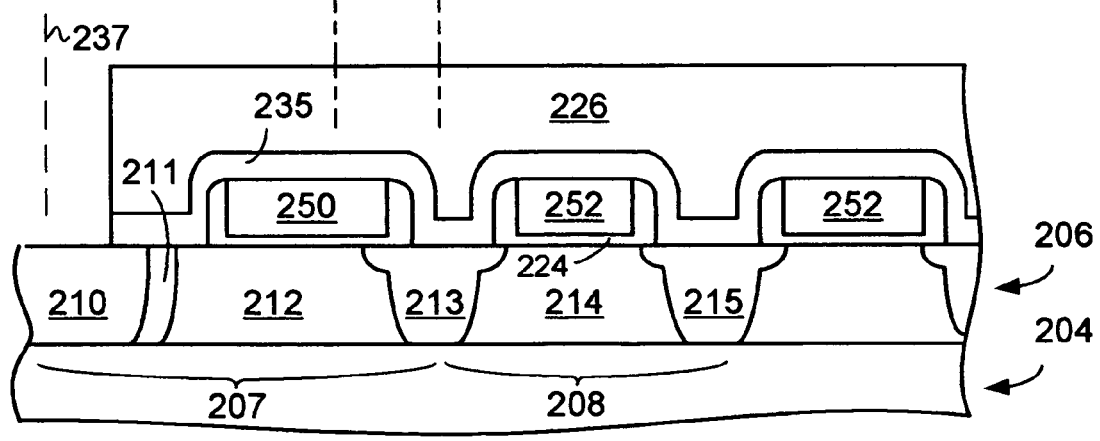
FIG. 6B is a simplified cross-sectional view of a portion of the semiconductor substrate of FIG. 6A, in a further stage of fabrication, showing formation of an anode emitter region together and a width to the N-base for the thyristor.

In yet another embodiment, referencing the simplified flow chart of FIG. 5 and the simplified sequence of FIGS. 6A-6B, a method 500 of fabricating a thyristor-based memory device may comprise implanting the indium and carbon immediately after preliminary front end CMOS processing. During the initial CMOS processing (block 502 of FIG. 5), wells and isolation structures may be formed and/or may also include preparing the SOI substrate similarly as described earlier relative to FIG. 1. Next, photoresist may be layered and patterned to form a mask 620 over the substrate. The photoresist patterning may define a window through the mask 620 for establishing an exposed region of the substrate. The exposed region may establish portions of silicon layer 206 into which the indium and carbon implants may be directed. The exposed region may include a nominal portion desired for the thyristor P-base region 212 and also a portion of the cathode-emitter region 213. In this particular embodiment, other regions of the substrate may be protected from the carbon or indium implants.

Further processes for the fabrication of the thyristor device of this method 500 may follow the procedures similar to those identified relative to the method 300 described earlier herein relative to FIG. 3. For example, once the carbon and indium have been implanted, photoresist of mask 620 may be removed and an optional thermal anneal performed for activation of the carbon and indium implants within the silicon. Or, alternatively, the activation of the indium and carbon implants might be performed in connection with subsequent annealing procedures during fabrication of the thyristor-based memory device. Such subsequent anneals might include those associated with the formation of gate oxides, gate electrodes, other dopant activation anneals and/or silicide procedures (see block 506 of FIG. 5.)

For example, in accordance with some embodiments, oxide 224 may be formed during a thermal oxidation by an environmental temperature of about 950 degrees Celsius for duration from 1 to 10 minutes. The oxide may then be annealed with temperature of around 1015 degrees Celsius for duration of several seconds to minutes. As presented here, the gate oxide formation may be represented as a part of forming the electrodes (block 508 of FIG. 5) for the gates to the access devices and the capacitor electrodes to the thyristors.

Polysilicon may then be layered over the gate oxide 224 and patterned for defining the gate electrode 252 and capacitor electrode 250 for the respective MOSFET and thyristor, respectively. The source/drain procedures may then be performed for defining the source and drain regions (block 510 of FIG. 5) to the access device, which may also include previous definition of extension regions and/or halo implants. These processes may be performed similarly as described before relative to previous embodiments.

The base and emitter regions to the thyristor may be formed (block 512 of FIG. 5) by implanting the respective N-type and P-type dopants, aligned relative to an extended silicide blocking mask 235, similarly as described before relative to the embodiments of FIGS. 1 through 4. For example, referencing FIG. 6B, the dielectric 235 may be layered conformally over the substrate with electrodes. Photoresist 226 may then be layered and patterned to assist formation of the N-base and anode-emitter regions to the thyristor (block 512 of FIG. 5). The exposed regions of the dielectric, as defined by the pattern of photoresist, may be etched selectively relative to the silicon for defining exposed regions of silicon between the capacitor electrodes of the two neighboring thyristors about mirror axis 237.

The etch may define a wing to the dielectric 235 for operability as a silicide blocking mask 235 beside the capacitor electrode 250. The wing of the salicide blocking mask 237, in combination with the photoresist, may then be used collectively as an implant mask during implant of N-type dopant for formation of N-base region 211 and implant of P-type dopant during formation of the anode-emitter region 210.

Further back-end CMOS processes (block 514 of FIG. 5) may then be performed for competing integration of the thyristor memory cell within and together with other logic circuitry or system elements of the semiconductor device.

Figure 7:
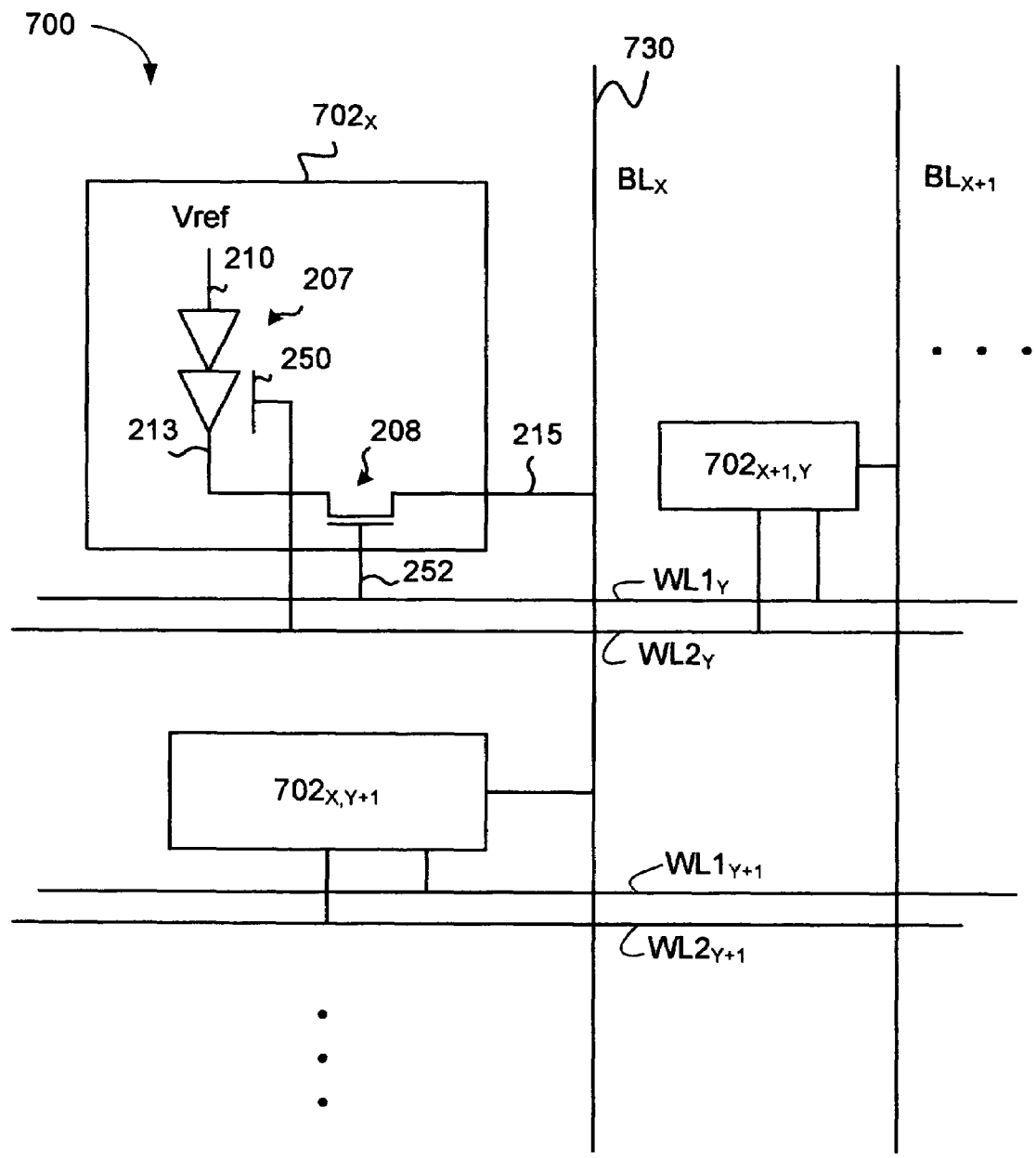
FIG. 7 is a schematic diagram of a portion of a memory array comprising a thyristor-based memory cell, as may be useful for gaining an understanding of certain embodiments of the present invention.

Referencing FIG. 7, a semiconductor device 700 may comprise a plurality of thyristor based memory cells 702, which may be disposed collectively as an array of rows (y) and columns (x). The cells 702 may comprise thyristor-based elements 207 corresponding to embodiments disclosed previously herein. A bitline 730 within the array may be coupled to a source/drain region 215 of respective access transistors 208 to memory cells of a given column (x). Gates 252 of respective access transistors 208 may be coupled to associate first wordlines (WL1); while capacitor electrodes 250 of respective thyristor devices 207 may be coupled to respective a second wordline (WL2) within given rows (y) of the array of semiconductor devices. By appropriate control of these wordlines, the contents of the thyristor-based memory cells 702 may be selectively driven for reading and/or writing data via the bitlines 730.

To assist with the stability and reliability of operation, the memory cells 702 of the memory array 700 may be formed with the implants of indium and carbon in the P-base regions of the thyristors 207. Again, the presence of carbon in the silicon layer may be sufficiently great to influence operative effects of the indium atoms in the silicon and to enhance activations within the silicon.

Many other embodiments will be apparent to those of skill in the art from the above description. The scope of the invention should be determined with reference to the appended claims along with the full scope of equivalents to which the claims are entitled.

What is claimed is:

1. A semiconductor device, comprising:
   a thyristor formed in semiconductor material, the thyristor comprising at least one base region having normal acceptor-type dopant; and
   complexes defined at least in part by atomic pairing of a high ionization energy acceptor and an activation species in a portion of the semiconductor material including at least a portion of the base region, wherein the high ionization energy acceptor is different from the normal acceptor-type dopant and of ionization energy greater than that of the normal acceptor-type dopant.

2. The device of claim 1, in which the activation species comprises carbon of density sufficient to influence ionization of the high ionization energy acceptor within the semiconductor material.

3. The device of claim 2, in which the high ionization energy acceptor comprises indium.

4. The device of claim 3, in which the complexes of the atomically paired indium and carbon are disposed in the P-base region of the thyristor.

5. The device of claim 1, in which:
   the semiconductor material comprises a layer of silicon disposed over dielectric;
   the activation species comprises carbon;
   the high ionization energy acceptor comprises indium;
   the indium and the carbon form indium-carbon atomically paired complexes in the silicon; and
   the carbon of density sufficient and operable to enhance activation efficacy of the indium in the portion of the silicon.

6. The device of claim 5, in which the at least one base region is a p-base region that defines a junction with a cathode-emitter region of the thyristor; and
   the complexes of the atomically paired indium-carbon have a distribution in the layer of silicon that overlaps the junction.

7. The device of claim 6, in which a constituent bipolar transistor of the thyristor associated with the p-base is characterized by a gain dependent on temperature; and
   the p-base comprises a concentration of the indium and the associated carbon complexes associated therewith sufficient to at least partly stabilize the gain of the constituent bipolar transistor over a given range of temperature.

8. The device of claim 7, in which the layer of silicon over the dielectric comprises a thickness less than 2000 Å and the portion with the complexes of the atomically paired indium-carbon comprises a concentration of the indium and the carbon sufficient for an activation density of at least $10^{18}$ per cm$^3$.

9. A thyristor-based semiconductor memory comprising:
   a thyristor comprising at least two base regions of opposite type conductivity;
   an electrode capacitively coupled to one of the two base regions of given dopant;
   complexes defined at least in part by atomic pairing of a high ionization energy acceptor with an activation species disposed in at least a portion of the one of the two base regions, the high ionization energy acceptor different from the given dopant and of ionization energy greater than that of the given dopant.

10. The memory of claim 9, in which the activation species comprises carbon of density sufficient to influence ionization of the high ionization energy acceptor in the semiconductor material.

11. The memory of claim 10, in which the high ionization energy acceptor comprises indium.

12. The memory of claim 10, in which the complexes of the atomically paired indium and the carbon are disposed in a P-base region of the thyristor.

13. The memory of claim 9, in which a constituent bipolar transistor of the thyristor associated with the one of the two base regions is characterized by a gain dependent on temperature; and
   the one of the two base regions comprises a concentration of the complexes sufficient to at least partly stabilize the gain of the constituent bipolar transistor over a given range of temperature.

14. The memory of claim 9, further comprising a gateable access device disposed electrically in series with the thyristor to define a cell to at least a portion of the thyristor-based memory.

15. The memory of claim 14, in which the gateable access device comprises at least a drain region, a source region and a body region therebetween, the drain region in common with a cathode-emitter region of the thyristor.

16. The memory of claim 15, in which the complexes define a distribution in the thyristor that extends across a junction that is defined between a p-base as said one of the two base regions and the cathode-emitter region.

17. The memory of claim 14, further comprising means for performing at least one of the operations of the group consisting of reading, storing or writing data from/into the cell of the thyristor-based memory.

* * * * *